United States Patent [19]

Szilagyi

[11] Patent Number: 4,963,748

[45] Date of Patent: Oct. 16, 1990

[54] COMPOSITE MULTIPURPOSE MULTIPOLE ELECTROSTATIC OPTICAL STRUCTURE AND A SYNTHESIS METHOD FOR MINIMIZING ABERRATIONS

[75] Inventor: Miklos N. Szilagyi, Tucson, Ariz.

[73] Assignee: Arizona Technology Development Corporation (ATDC), Tucson, Ariz.

[21] Appl. No.: 202,261

[22] Filed: Jun. 6, 1988

[51] Int. Cl.[5] .................. H01J 3/12; H01J 3/18; H01J 3/26

[52] U.S. Cl. .................. 250/396 R; 250/398; 250/492.2; 313/361.1

[58] Field of Search .......... 250/396 R, 398, 492.2; 313/361.1, 437, 444

[56] References Cited

U.S. PATENT DOCUMENTS

| | | | |
|---|---|---|---|
| 2,919,381 | 12/1959 | Glaser | 250/396 R |
| 3,805,106 | 4/1974 | Hooker | 313/444 |
| 4,389,571 | 6/1983 | Crewe | 250/396 R |
| 4,736,106 | 4/1988 | Kashy et al. | 250/396 R |
| 4,743,756 | 5/1988 | Krivanek | 250/396 R |
| 4,763,003 | 8/1988 | Maschke | 250/396 R |
| 4,795,912 | 1/1989 | Maschke | 250/396 R |
| 4,818,872 | 4/1989 | Parker et al. | 250/396 R |
| 4,823,013 | 4/1989 | van der Mast | 250/396 R |

OTHER PUBLICATIONS

M. Szilagyi, An article entitled: A Solution to the Problem of the Ideal Quadrupole Lens, Optik, 50 (1978), pp. 121-128, Stuttgart, W. Germany.

F. H. Read, An article entitled: A Moveable Electrostatic Lens, Jan. 17, 1983, in J. Phys. E: Sci. Instrum., vol. 16, 1983, Great Britian.

Primary Examiner—Jack I. Berman
Attorney, Agent, or Firm—Victor Flores

[57] ABSTRACT

This invention discloses a composite electrostatic optical apparatus and methods of using in micro fabrication processes or similar processes requiring the use of optical columns provided with electron or ion beams. The composite optical apparatus includes a series of units, each having multiple electrodes, that combine to form a composite optical structure that when coupled to a power supply define a three-dimensional potential distribution function. The shape of the composite optical structure is determined by the geometrical shape of an individual electrode and the arrangement of electrodes around the z-axis that forms a unit. The composite optical apparatus may be placed in an optical column as an electrosttic deflector, as a focusing electrostatic lens or as both deflector and focusing lens, or any combination of them. The composite optical structure enables scientific determination of an optimized potential distribution within the optical structure for minimizing focusing or deflection aberrations of electron or ion beams in an optical column. The method concerns a synthesis approach for minimizing aberrations in optical columns using the composite optical apparatus and various industrial applications.

14 Claims, 3 Drawing Sheets

COMPOSITE MULTIPURPOSE MULTIPOLE ELECTROSTATIC OPTICAL STRUCTURE AND A SYNTHESIS METHOD FOR MINIMIZING ABERRATIONS

FIELD OF THE INVENTION

This invention relates to electrostatic optical devices used to control the focusing and deflection of charged particle beams, in particular the invention relates to composite electrostatic structures comprising a series of units having electrodes capable of producing a three dimensional potential function that controls the focusing and deflection properties and minimizes the aberrations of electron and ion beams in an optical column. The methods relate to designing electrostatic deflectors and focusing lenses and processes using them, more particularly, the method relates to designing electrostatic deflectors and focusing lenses using a synthesis approach, and to process methods that use optical columns having submicron fabrication capability.

DESCRIPTION OF THE PRIOR ART

An ideal multipole lens consisting of a number of identical infinite hyperbolic surfaces held at alternate positive and negative potentials is known to provide a solution for the problem of reducing aberrations of charged particle beams. However, since infinite surfaces are not realizable, approximate solutions are required, the most commonly used approximate solution being a number of cylindrical rods. Alternative structures having a greater number of electrodes, i.e. multipole lenses with single plane potential distribution solutions are known and have been documented by the applicant in Hungarian Patent No. 173,743, issued May 24, 1974.

These multipole lenses are commonly used in particle accelerators, spectrometers and other electron and ion beam devices for focusing, deflection and control of charged particle beams as well as for the correction of aberrations. Multipole systems can also stand alone as complete optical columns. Such systems are expected to have lower aberrations than conventional axially symmetric ones, however their extreme complexity requires the overcoming of major design obstacles before being realized.

According to the Hungarian Patent No. 173,743, any deflector or multipole lens can be approximated with a high degree of accuracy by a system consisting of an arbitrary number of electrodes or poles arranged around a cylindrical surface and held at suitably chosen potentials, see octupole deflector shown in FIG. 1. This type of structure, although designed having a multipole electrode arrangement, does not allow control of the potential distribution along the optical column axis, i.e. in the z direction.

It is also known that a system of short cylinders can be used for the production of different axially symmetric electrostatic lenses by changing the voltages on the cylinders, see the focusing lens in FIG. 2, showing a series of twelve (12) non-segmented ring electrodes.

The known methods of designing electrostatic deflectors are trial and error analysis methods, whereby a designer uses different geometric arrangements until a satisfactory result is achieved. The deficiencies of adequate reduction of aberrations is typically compensated by using several elements in combination with the designed electrostatic lens or deflector. An octupole deflector, which is known to be a relatively good deflector, can be used as a pre-lens, post-lense or in-lens deflector to reach a desired deflection sensitivity. The electrode voltages are typically given while the geometric parameters are varied until a satisfactory performance is produced. Typically, there is very limited play with the parameters of an octupole deflector, the designer may vary one electrical parameter, the length and location of the deflector, until the best result is achieved. This is a fine tuning trial and error approach that does not give a designer control over minimizing the aberrations, hence it is not possible to optimize target spot size resolution and increase the current density of the beam.

The underlying reason for reducing aberrations is that aberrations determine the spot size of a charged particle beam on a given target which in turn relates to a measurement of performance of an optical column. The known electrostatic deflectors can not be controlled to reduce the aberrations of the optical column, hence can not control the spot size nor increase the current density of the beam. This limitation greatly affects productivity in processes involving technologies that are concerned with microstructures, such as microfabrication of integrated circuits where a charged particle beam must scan the chip surface to write very sharp lines. The integrated circuit industry has constantly been requiring greater and greater performance in methods of writing lines on a chip surface. The chip fabrication industry has evolved from using light beams that write lines on a surface with a resolution not better than 0.5 micrometers, the limitation being due to diffraction, to using electron or ion beams to write lines smaller than ½ micron, but only with small current densities, the limitation being due to the problem of aberrations of the optical system.

The relationship between spot size, aberrations and current density can be seen from reviewing the following two formulas:

$$r^2 = [(Mr_o)^2 + (dr_s)^2 + (dr_c)^2 + (dr_{defl})^2], \qquad (1)$$

where r is the spot size radius, M is the magnification of the system, $r_o$ is the beam source radius, $dr_s$ is the spherical aberration disk radius, $dr_c$ is the chromatic aberration disk radius and $dr_{defl}$ is the deflection aberration, collectively known as parasitic aberrations.

$$J = I/(r^2\pi), \qquad (2)$$

where J is the current density, r is the spot size radius and I is the current available from the electron or ion beam source.

By inspection of the two formulas it is seen that reduction of the spot radius is accomplished by reduction of the parasitic aberrations. The spherical and chromatic aberrations can be reduced by the appropriate design of the axially symmetric lens structure, while reduction of the deflection aberrations requires producing a three-dimensional potential distribution that is not easily realized using presently known methods. Since the current density is inversely proportional to the square of the spot size radius, any reduction in spot size, i.e., by reducing the aberrations, will result in increase of the current density of the beam.

Thus, a need is seen to exist for an electrostatic optical apparatus for use in charged particle beam optical columns that can be controlled to reduce aberrations and optimize resolution and increase current density of the beam to meet the processing needs of modern technologies.

A need is seen to exist for providing solutions for processes requiring improved resolution and improved scanning performance to enable the production of design patterns for use in microfabrication processes, maskless optoelectronic integrated circuit fabrication, microprobe analysis, micro-lithography, maskless implantation doping, microprobe analysis, scanning microscopy, secondary ion mass spectrometry, etching, deposition, micro-machining, mask repair and integrated circuit testing and diagnostics.

A need is seen to exist for a more scientific approach for solving problems of reducing aberrations in optical columns that involve easily manufactured electrostatic optical elements and that can be controlled to produce a desired three-dimensional potential distribution.

SUMMARY OF THE INVENTION

Accordingly, the primary object of the present invention is to solve these deficiencies by providing a composite lens apparatus that is an easily manufactured geometrical structure that enables a designer to use a synthesis approach to produce a three dimensional potential distribution function that defines the electrode voltages that result in reducing the aberrations.

The composite lens apparatus includes a series of units, that are not discrete lenses, but are simple structures each having multiple electrodes that combine to form a composite lens structure that when coupled to a power supply define a three-dimensional potential distribution function. The shape of the composite lens structure is determined by the geometrical shape of the individual electrodes and the arrangement of electrodes forming the units along the axis of the optical column. The composite lens apparatus may be placed in an optical column as an electrostatic deflector or as a focusing electrostatic lens. The composite lens structure enables scientific determination of an optimized potential distribution within the lens structure for minimizing focusing or deflection aberrations of electron or ion beams in an optical column.

The method is primarily concerned with a procedure that utilizes a synthesis approach for minimizing aberrations in optical columns using the composite lens apparatus of the present invention. The methods of using the composite lens include procedures for use in industrial applications. More specifically, the synthesis approach relates to using the composite lens structure of the present invention and appropriate user system requirements that are mathematically manipulated using known constrained non-linear optimization techniques to arrive at the optimized electrode voltages. The voltages are then applied to the electrodes of the composite lens structure to minimize the aberrations and satisfy the system requirements.

Therefore, to the accomplishments of the foregoing objects, the invention consists of the foregoing features hereinafter fully described and particularly pointed out in the claims, the accompanying drawings and following disclosure describing in detail the invention, such drawings and disclosure illustrating, however, but one of the various ways in which the invention may be practiced.

DESCRIPTION OF THE PREFERRED EMBODIMENTS

Figure 1:
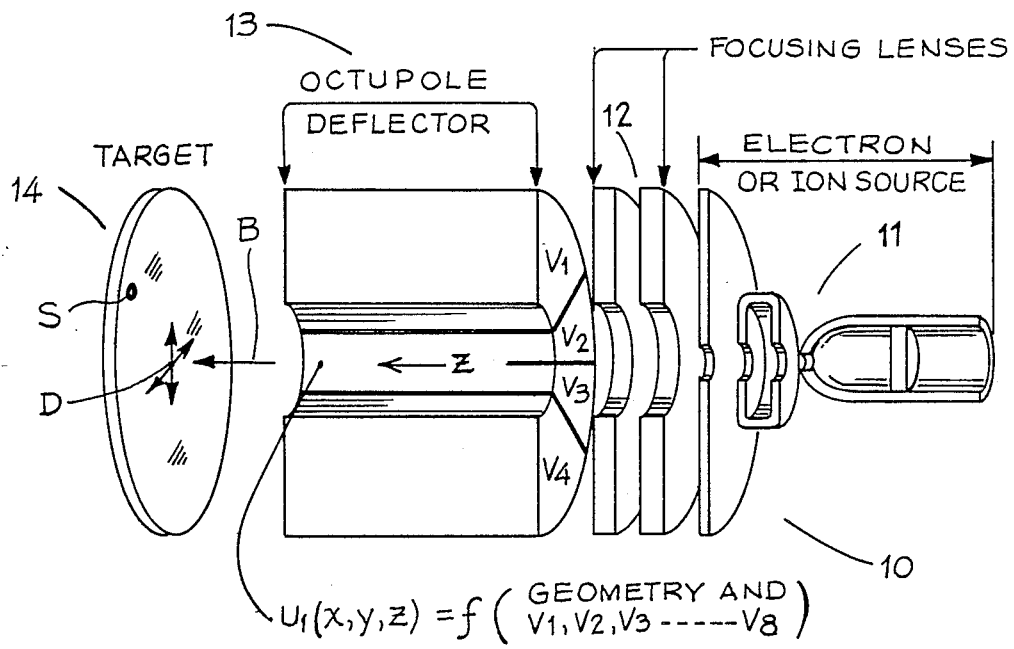
FIG. 1 is a sectional perspective view illustrating an electron or ion beam optical column of the prior art including an octupole deflector.
Figure 2:
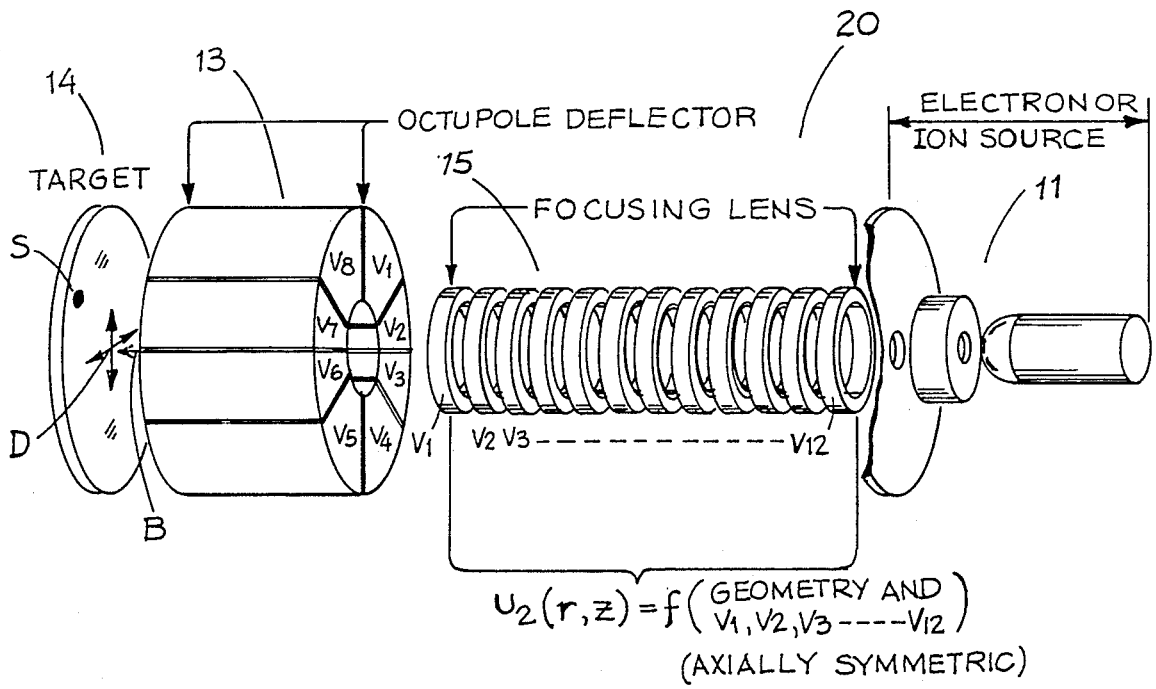
FIG. 2 is a perspective view of a prior art ion beam optical column illustrating the focusing electrostatic lens as a series of non-segmented rings arranged to produce an axially symmetric potential distribution.

Before describing the preferred embodiment of the present invention, a description of prior art optical columns 10 and 20 shown in FIG. 1 and FIG. 2 will serve as an introduction. Optical columns for generation of charged particle beams are generally comprised of an electron or ion source 11. Since charged partical beam B directed at target 14 must have accurate spot size S resolution and scanning D characteristics, the design of optical columns includes focusing lenses 12 and deflector 13. The design of electrostatic deflectors, such as the depicted octupole deflector 13, involves trial and error methods before arriving at the depicted shape. Also, the depicted shape is limited in performance due to the complexity associated with changing the potential function U1, a change that requires a different structure. The potential function U1 is also limited due to the geometric structure, hence no control of aberrations is possible in the z direction. The focusing lens structure 15 depicted in FIG. 2, is an axially symmetric structure with a series of rings that does control the potential distribution in the z direction, but it is limited in that it produces a potential distribution, U2, only in an axially symmetrical manner.

Figure 3:
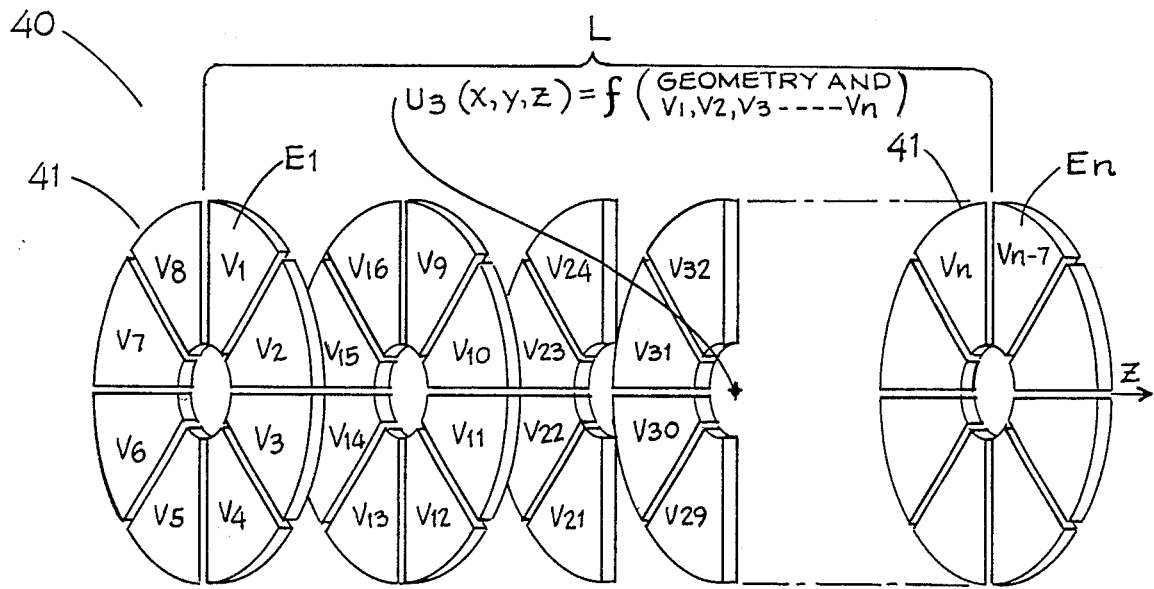
FIG. 3 is a perspective view of a composite electrostatic optical structure of the present invention illustrating a plurality of easily manufactured disk-like units formed by multiple discrete electrodes arranged along the optical column axis and provided with electrode voltages that can be controlled to produce a three-dimensional potential distribution that reduces aberrations.
Figure 4:
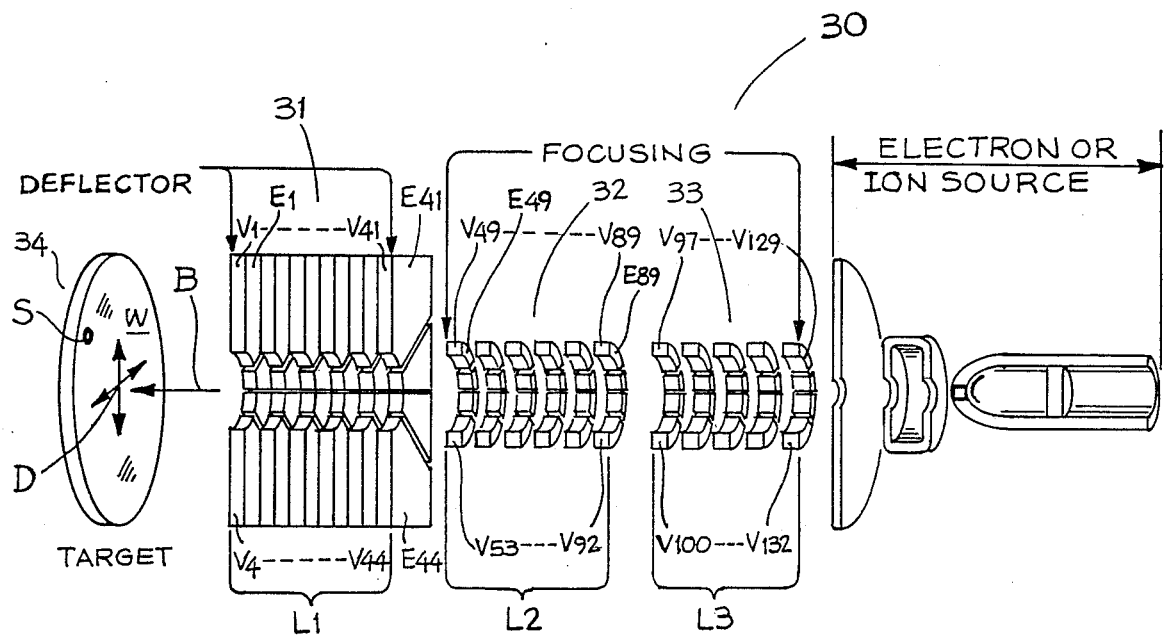
FIG. 4 is a sectional perspective view of an optical column illustrating a rectangular-shaped composite electrostatic deflector and a pair of ring-shaped composite focusing electrostatic lenses according to the present invention.

Referring now to FIG. 3, where a composite electrostatic structure 40, according to the present invention, is shown comprising a single optical structure L having a series of units 41 formed by an arrangement of electrodes E1 through En. The embodiment 40 illustrates an easily manufactured geometry and could comprise other composite geometric structures such as deflector L1 and focusing lenses L2 and L3 having numerals 31, 32 and 33, as depicted in the optical column 30 of FIG. 4. The intent being to provide a composite structure, such as embodiment 40 that a designer can use in a synthesis approach to produce a three-dimensional potential function U3 from which the electrode voltages V1 through Vn can be determined and applied to satisfy a given set of optical column system design requirements and constraints and minimize the aberrations.

Figure 5:
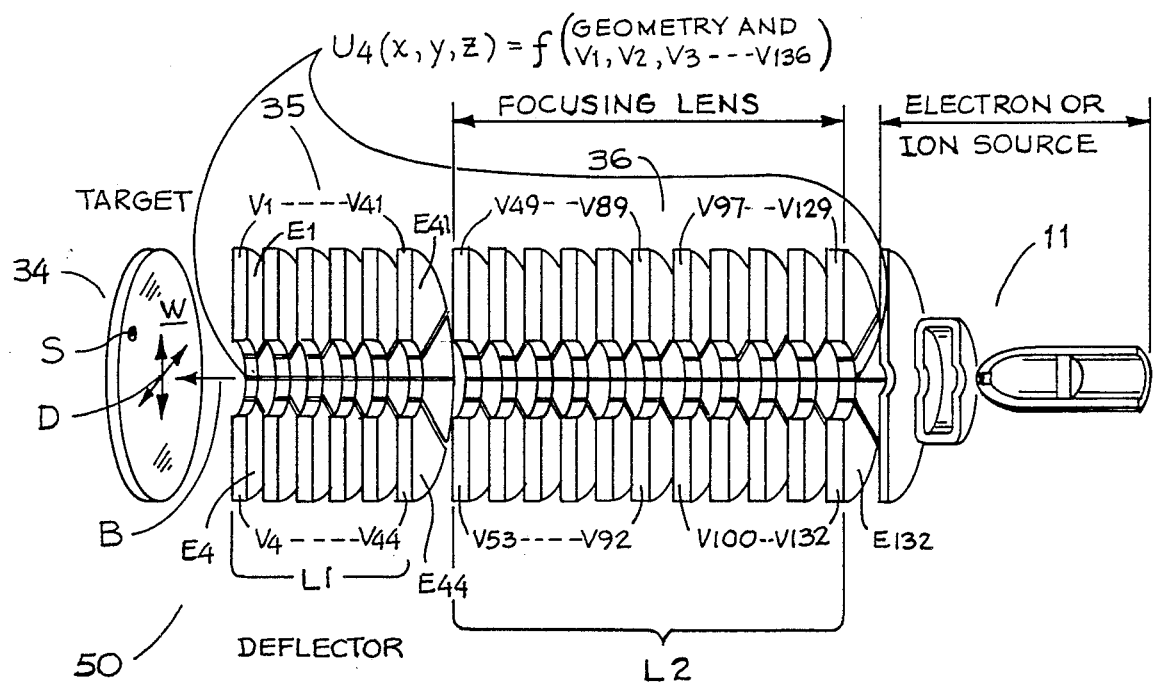
FIG. 5 is a sectional perspective view of an optical column illustrating an electrostatic deflector and a focusing electrostatic lens designed according to the composite disk-like structure shown in FIG. 3.

FIG. 5 illustrates an optical column 50 showing deflector L1 and focusing lens L2 adapted according to the disk-like composite embodiment 40 having a three-dimensional potential distribution function U4. It should be appreciated that the plurality of electrodes, E1–E48 for deflector 35 and E49–E136 for focusing lens 36, (E136 being located on unit not shown) offer a high degree of aberration control as the electron beam passes through respective units along the optical column's axis.

Figure 6:
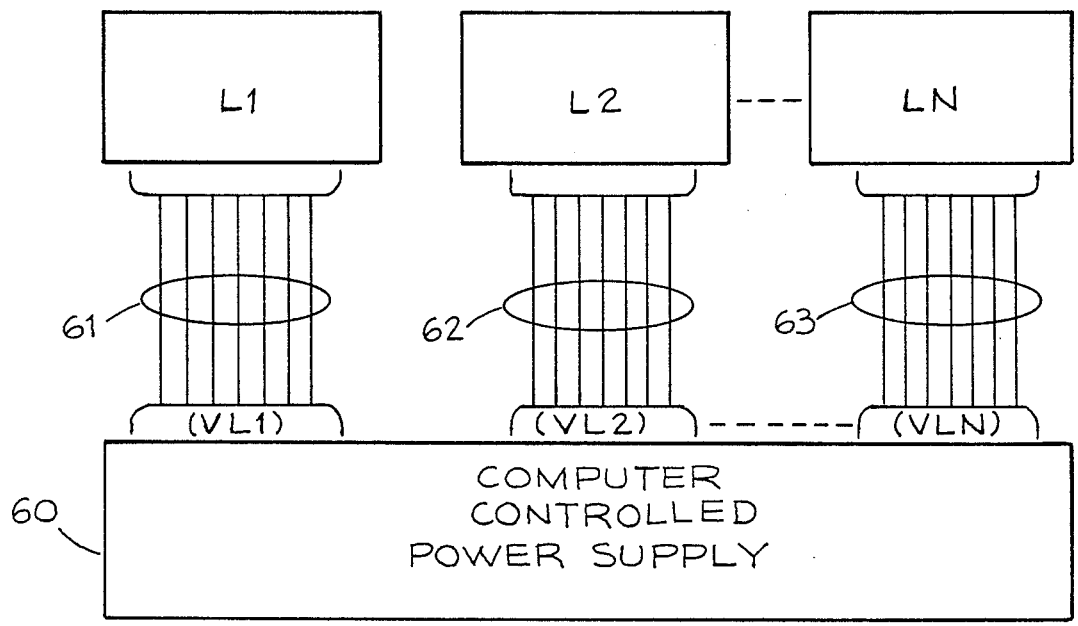
FIG. 6 is a schematic diagram showing an electrically coupled arrangement providing voltages to N different composite electrostatic optical structures from a computer controlled power supply.

FIG. 6 illustrates a schematic diagram of an electrically coupled arrangement between composite lenses L1–LN and a computer controlled power supply 60 whereby electrode voltages are distributed via interconnecting means 61, 62, and 63. Since the electrode voltages are independently controlled, a single composite optical structure 40 can serve as a deflector and focusing lens.

In actual applications, target 34, associated with optical columns 30 or 50, having composite electrostatic structures according to the present invention, are actual surfaces of workpieces W in fabrication processes such as in the production of design patterns for use in microfabrication processes, maskless optoelectronic integrated circuit fabrication, microprobe analysis, microlithography, maskless implantation doping, microprobe analysis, scanning microscopy, secondary ion mass spectrometry, etching, deposition, micro-machining, mask repair and integrated circuit testing and diagnostics.

Therefore, while the present invention has been shown and described herein in what is believed to be the most practical and preferred embodiments, it is recognized that departures can be made therefrom within the scope of the invention, which is therefore not to be limited to the details disclosed herein but is to be accorded the full scope of the claims so as to embrace any and all equivalent apparatus.

I claim:

1. A composite electrostatic optical apparatus for use as optical structures functioning as electrostatic deflectors and focusing electrostatic lenses and being used for minimizing the aberrations of a charged partical beam in an optical column containing said optical structures, said composite electrostatic optical apparatus comprising:

any one of said optical structures being formed from a series of at least two electrostatic units arranged along an optical column axis, each one of said units comprising an arrangement of a plurality of electrically insulated electrodes arranged on a common plane around said optical column axis, each one of said plurality of electrodes having an electrical conducting means for receiving a voltage that combines with other electrode voltages in said series of at least two electrostatic units to produce a continuous and controllable three-dimensional potential distribution within any one of said optical structures that is variable along said axis and that reduces aberrations.

2. An optical column apparatus comprising a charged particle beam source, a target, a power supply, an electrostatic deflector, and a focusing electrostatic lens, said optical column apparatus comprising:

said focusing electrostatic lens comprising a series of at least two electrostatic units arranged along an optical column axis, each one of said units comprising an arrangement of a plurality of electrically insulated electrodes arranged on a common plane around said optical column axis and being electrically coupled to said power supply, said power supply providing a respective voltage on each electrode member of said plurality of electrodes to produce an optimized, continuous and controlled three-dimensional focusing potential distribution within said focusing electrostatic lens that is variable along said axis and which minimizes focusing aberrations.

3. An optical column apparatus as recited in claim 2, wherein:

said focusing electrostatic lens comprises a series of cylindrical units each unit having a plurality of identical electrodes, said power supply providing equal voltages to each of said electrodes in each unit to produce a continuous, controlled and optimized axially symmetric three-dimensional potential distribution within said focusing electrostatic lens that is variable along said axis.

4. An optical column apparatus comprising a charged particle beam source, a target, a power supply, an electrostatic deflector, and a focusing electrostatic lens, said optical column apparatus comprising:

said electrostatic deflector comprising a series of at least two electrostatic units arranged along an optical column axis, each one of said units comprises an arrangement of a plurality of electrically insulated electrodes arranged on a common plane around said optical column axis and being electrically coupled to said power supply, said power supply providing a respective voltage on each electrode member of said plurality of electrodes to produce an optimized, continuous and controlled three-dimensional deflection potential distribution within said electrostatic deflector that is variable along said axis and which minimizes deflection aberrations.

5. An optical column apparatus as recited in claim 4, wherein said focusing electrostatic lens comprises:

a series of at least two electrostatic units arranged along said optical column axis, each one of said units comprising an arrangement of a plurality of electrically insulated electrodes arranged on a common plane around said optical column axis and being electrically coupled to said power supply, said power supply providing a respective voltage on each electrode member of said plurality of electrodes to produce a continuous, controlled and optimized three-dimensional focusing potential distribution within said focusing electrostatic lens that is variable along said axis and which minimizes focusing aberrations.

6. An optical column apparatus as recited in claim 5, wherein:

said power supply is a computer controlled power supply.

7. An optical column apparatus as recited in claim 5, wherein:

said focusing electrostatic lens and said electrostatic deflector are a single composite electrostatic optical apparatus for focusing and deflecting purposes.

8. A composite electrostatic optical apparatus for use as optical structures functioning as electrostatic deflectors and focusing electrostatic lenses and being used for minimizing the aberrations of a charged partical beam in an optical column containing said optical structures, said composite electrostatic optical apparatus comprising:

any one of said optical structures being formed from a series of at least two electrostatic units arranged along an optical column axis, each one of said units comprising an arrangement of a plurality of electrically insulated electrodes arranged on a common plane around said optical column axis, each one of said plurality of electrodes having an electrical conducting means for receiving a controlled voltage that combines with other electrode voltages in said series of at least two electrostatic units to produce a continuous and controllable a three-dimensional potential distribution within any one of said optical structures that is variable along said axis and that reduces aberrations, each one of said at least two electrostatic units being geometrically designed in a manufacturable, substantially thin wafer, disk-like shape having substantially equal segments.

9. A method of reducing aberrations in a charged particle beam optical column, said optical column being designed according to predetermined design objectives and constraints, said constraints comprising system requirements including deflection sensitivity, working distances, dielectric characteristics, energy of the particle beam, spot size radius, maximum limits on electric fields, maximum and minimum limits on voltages, said objectives comprising resolution and current density improvements, said method comprising the steps of:

(a) providing an optical column comprising a particle beam source, a target and a power supply;

(b) providing a composite electrostatic optical apparatus for use as optical structures that function as electrostatic deflectors and as focusing electrostatic lenses and are used for minimizing the aberrations of a charged partical beam in an optical column containing said optical structures, said composite electrostatic optical apparatus comprising:

any one of said optical structures being formed from a series of at least two electrostatic units arranged along an optical column axis, each one of said units comprising an arrangement of a plurality of electrically insulated electrodes arranged on a common plane around said optical column axis, each one of said plurality of electrodes having an electrical conducting means for receiving a controlled voltage that combines with other electrode voltages in said series of at least two electrostatic units to produce a continuous and controllable three-dimensional potential distribution within any one of said optical structures that is variable along said axis and that reduces aberrations;

(c) providing a focusing electrostatic lens configured using said composite electrostatic optical apparatus in said optical column, said composite electrostatic optical apparatus having a number of electrostatic units, each unit being a manufacturable geometric structure;

(d) producing a three-dimensional optimized focusing potential distribution function using a synthesis approach comprising a nonlinear constrained optimization technique, considering said optical column design constraints and appropriate geometrical properties of said composite number of units having said manufacturable geometric structure;

(e) determining each electrode voltage to be applied to each respective electrode according to said produced three-dimensional optimized focusing potential distribution function;

(f) applying said determined electrode voltages to said respective electrodes via said electrical conducting means from said power supply;

(g) determining a beam spot size resulting after said application of voltages to said composite electrostatic optical apparatus; and (h) comparing said beam spot size against said optical column design objectives.

10. A method of reducing aberrations in a charged particle beam optical column as recited in claim 9, wherein said method further includes the steps of:

(i) providing an electrostatic deflector configured using said composite electrostatic optical apparatus in said optical column, said composite electrostatic optical apparatus having a number of electrostatic units, each unit being a manufacturable geometric structure;

(j) producing a three-dimensional optimized deflection potential distribution function using a synthesis approach comprising a nonlinear constrained optimization technique, considering said optical column design constraints and required geometrical properties of said composite number of units having said manufacturable geometric structure;

(k) determining each electrode voltage to be applied to each respective electrode according to said produced three-dimensional optimized deflection potential distribution function;

(l) applying said determined electrode voltages to said respective electrode via said electrical conducting means from said power supply;

(m) determining a beam spot size resulting after said application of voltages to said composite electrostatic optical apparatus; and (n) comparing said beam spot size against said optical column design objectives.

11. A method of reducing aberrations in a charged particle beam optical column as recited in claim 10, wherein said steps of providing an optical column comprises providing a computer controlled power supply.

12. A method of reducing aberrations in a charged particle beam optical column as recited in claim 10, wherein said method further comprises the step of:

(o) providing a workpiece as said target in an industrial application producing product having design patterns, said industrial application comprising microfabrication processes, maskless optoelectronic integrated circuit fabrication, microprobe analysis, micro-lithography, maskless implantation doping, microprobe analysis, scanning microscopy, secondary ion mass spectrometry, etching, deposition, micro-machining, mask repair and integrated circuit testing and diagnostics; and (p) producing said product having submicron dimension design patterns using said provided composite electrostatic optical apparatus.

13. A method of reducing aberrations in a charged particle beam optical column, said optical column being designed according to predetermined design objectives and constraints, said constraints comprising system requirements including deflection sensitivity, working distances, dielectric characteristics, energy of the particle beam, spot size radius, maximum limits on electric fields, maximum and minimum limits on voltages, said objectives comprising resolution and current density improvements, said method comprising the steps of:

(a) providing an optical column comprising a particle beam source, a target and a power supply;

(b) providing a composite electrostatic optical apparatus for use as optical structures that function as electrostatic deflectors and as focusing electrostatic lenses and being used for minimizing the aberrations of a charged partical beam in an optical column containing said optical structures, said composite electrostatic optical apparatus comprising:

any one of said optical structures being formed from a series of at least two electrostatic units arranged along an optical column axis, each one of said units comprising an arrangement of a plurality of electrically insulated electrodes arranged on a common plane around said optical column axis, each one of said plurality of electrodes having an electrical conducting means for receiving a controlled voltage that combines with other electrode voltages in said series of at least two electrostatic units to produce a continuous and controllable three-dimensional potential distribution within any one of said optical structures that is variable along said axis and that reduces aberrations;

(c) providing an electrostatic deflector configured using said composite electrostatic optical apparatus in said optical column, said composite electrostatic optical apparatus having a number of electrostatic units, each unit being a manufacturable geometric structure;

(d) producing a three-dimensional optimized deflection potential distribution function using a synthesis approach comprising a nonlinear constrained optimization technique, considering said optical column design constraints and required geometrical properties of said number of units having said manufacturable geometric structure;

(e) determining each electrode voltage to be applied to each respective electrode according to said produced three-dimensional optimized deflection potential distribution function;

(f) applying said determined electrode voltages to said respective electrodes via said electrical conducting means from said power supply;

(g) determining a beam spot size resulting after said application of voltages to said composite electrostatic optical apparatus; and (h) comparing said beam spot size against said optical column design objectives.

14. A method of reducing aberrations in a charged particle beam optical column, said optical column being designed according to predetermined design objectives and constraints, said constraints comprising system requirements including deflection sensitivity, working distances, distances, dielectric characteristics, energy of the particle beam, spot size radius, maximum limits on electric fields, maximum and minimum limits on voltages, said objective comprising resolution and current density improvements, said method comprising the steps of:

(a) providing an optical column comprising a particle beam source, a target and a power supply;

(b) providing a composite electrostatic optical apparatus for use as optical structures that function as electrostatic deflectors and as focusing electrostatic lenses and being used for minimizing the aberrations of a charged partical beam in an optical column containing said optical structures, said composite electrostatic optical apparatus comprising:

any one of said optical structures being formed from a series of at least two electrostatic units arranged along an optical column axis, each one of said units comprising an arrangement of a plurality of electrically insulated electrodes arranged on a common plane around said optical column axis, each one of said plurality of electrodes having an electrical conducting means for receiving a controlled voltage that combines with other electrode voltage in said series of at least two electrostatic units to produce a continuous and controllable three-dimensional potential distribution within any one of said optical structures that is variable along said axis and that reduces aberrations;

(c) providing a focusing electrostatic lens configured using said composite electrostatic optical apparatus in said optical column, said composite electrostatic optical apparatus having a number of electrostatic units, each unit being a manufacturable geometric structure;

(d) producing electrode voltages directly by using nonlinear constrained optimization techniques on the basis of on-line measurement of said beam spot size radius and current density of said charged particle beam;

(e) applying said determined electrode voltages to said respective electrodes via said electrical conducting means from said power supply;

(f) determining a beam spot size resulting after said application of voltages to said composite electrostatic optical apparatus;

(g) comparing said beam spot size against said optical column design objectives;

(h) determining each electrode voltage to be applied to each respective electrode according to said produced three-dimensional optimized deflection potential distribution function;

(i) applying said determined electrode voltages to said respective electrode via said electrical conducting means from said power supply;

(j) determining a beam spot size resulting after said application of voltages to said composite electrostatic optical apparatus; and (k) comparing said beam spot size against said optical column design objectives.

* * * * *